US011537863B2

(12) United States Patent
Leobandung et al.

(10) Patent No.: US 11,537,863 B2
(45) Date of Patent: Dec. 27, 2022

(54) RESISTIVE PROCESSING UNIT CELL HAVING MULTIPLE WEIGHT UPDATE AND READ CIRCUITS FOR PARALLEL PROCESSING OF DATA USING SHARED WEIGHT VALUE

(71) Applicant: International Business Machines Corporation, Armonk, NY (US)

(72) Inventors: Effendi Leobandung, Stormville, NY (US); Zhibin Ren, Hopewell Junction, NY (US); Malte Rasch, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 720 days.

(21) Appl. No.: 16/568,950

(22) Filed: Sep. 12, 2019

(65) Prior Publication Data

US 2021/0081775 A1 Mar. 18, 2021

(51) Int. Cl.
*G06N 3/063* (2006.01)
*G06N 3/04* (2006.01)
(Continued)

(52) U.S. Cl.
CPC ............ *G06N 3/0635* (2013.01); *G06N 3/04* (2013.01); *G06N 3/08* (2013.01); *G11C 13/003* (2013.01); *G11C 13/004* (2013.01)

(58) Field of Classification Search
CPC .......... G06N 3/0635; G06N 3/04; G06N 3/08; G06N 3/0454; G06N 3/084; G11C 13/003;
(Continued)

(56) References Cited

U.S. PATENT DOCUMENTS 5,479,579 A 12/1995 Duong et al.
9,852,790 B1 * 12/2017 Gokmen .................. G06N 3/02
(Continued)

OTHER PUBLICATIONS

S. Ambrogio et al., "Equivalent-Accuracy Accelerated Neural-Network Training Using Analogue Memory," Nature, Jun. 7, 2018, 23 pages, vol. 558.

(Continued)

*Primary Examiner* — Ajay Ojha
(74) *Attorney, Agent, or Firm* — Robert Sullivan; Ryan, Mason & Lewis, LLP

(57) ABSTRACT

A resistive processing unit cell includes a weight storage device to store a weight value of the resistive processing unit cell, and multiple circuit blocks. Each circuit block includes a weight update circuit coupled to dedicated update control lines, and a weight read circuit coupled to dedicated read control lines. The circuit blocks are configured to operate in parallel to (i) perform separate weight read operations in which each read circuit generates a read current based on a stored weight value, and outputs the read current on the dedicated read control lines of the read circuit, and (ii) perform separate weight update operations in which each update circuit receives respective update control signals on the dedicated update control lines, generates update currents based on the respective update control signals, and applies the update current to the weight storage device to adjust the weight value based on the update current.

20 Claims, 5 Drawing Sheets

(51) Int. Cl.
  *G11C 13/00* (2006.01)
  *G06N 3/08* (2006.01)
(58) Field of Classification Search
  CPC .... G11C 13/004; G11C 13/0021; G11C 11/54
  See application file for complete search history.

(56) References Cited

U.S. PATENT DOCUMENTS

| | | |
|---|---|---|
| 10,204,907 B2 | 2/2019 | Leobandung et al. |
| 2015/0278682 A1 | 10/2015 | Saxena |
| 2017/0169327 A1 | 6/2017 | Nestler et al. |
| 2017/0329575 A1 | 11/2017 | Gu et al. |
| 2018/0018559 A1* | 1/2018 | Yakopcic ............. G11C 13/004 |
| 2018/0053089 A1* | 2/2018 | Gokmen ............. G06N 3/0635 |
| 2018/0075338 A1* | 3/2018 | Gokmen ................. G06N 3/08 |
| 2019/0080231 A1 | 3/2019 | Nestler et al. |
| 2019/0102359 A1 | 4/2019 | Knag et al. |

OTHER PUBLICATIONS

T. Gokmen et al., "Acceleration of Deep Neural Network Training with Resistive Cross-Point Devices: Design Considerations," Frontiers in Neuroscience, Jul. 21, 2016, 13 pages, vol. 10, No. 333.

S. Kim et al., "Analog CMOS-Based Resistive Processing Unit for Deep Neural Network Training," IEEE 60th International Midwest Symposium on Circuits and Systems (MWSCAS), Aug. 6-9, 2017, 4 pages.

T. Gokmen et al., "Training Deep Convolutional Neural Networks with Resistive Cross-Point Devices," Frontiers in Neuroscience, Oct. 10, 2017, 13 pages, vol. 11, No. 538.

* cited by examiner

400

500

RESISTIVE PROCESSING UNIT CELL HAVING MULTIPLE WEIGHT UPDATE AND READ CIRCUITS FOR PARALLEL PROCESSING OF DATA USING SHARED WEIGHT VALUE

TECHNICAL FIELD

This disclosure relates generally to resistive processing unit (RPU) systems and, in particular, to techniques for implementing convolutional layers for neural networks using RPU systems.

BACKGROUND

In recent years, deep neural network (DNN) based models have made significant progress due to the availability of large labeled datasets and continuous improvements in computation resources. DNNs are utilized in various applications including, for example, object/speech recognition, language translation, pattern extraction, and image processing. The quality of the DNN models depends on the processing of a large amount of training data and an increased complexity of the neural network. In this regard, training a complex DNN model is a time consuming and computationally intensive task which can require many days or weeks to perform using parallel and distributed computing frameworks with many computing nodes (e.g., datacenter-scale computational resources) to complete the training of the DNN model. A convolutional neural network is one type of DNN.

To reduce training time, hardware acceleration techniques for processing DNN workloads have been pursued either in conventional CMOS technologies or by using emerging non-volatile memory (NVM) technologies. However, it has been found that RPU accelerator devices have the potential to accelerate DNN training by orders of magnitude, while using less power, as compared to conventional hardware acceleration techniques. DNN training generally relies on a backpropagation algorithm which includes three repeating cycles: forward, backward and weight update. It has been determined that RPU accelerator devices which are based on a two-dimensional (2D) crossbar array of RPU storage cells, can be configured to perform all three cycles of the backpropagation algorithm in parallel, thus potentially providing significant acceleration in DNN training with lower power and reduced computation resources as compared to state-of-the-art implementations using central processing units (CPUs) and graphics processing units (GPUs). An RPU accelerator can store and update weight values locally, thereby minimizing data movement during the training process and fully exploiting the locality and the parallelism of the DNN training process. A stochastically trained DNN comprising arrays of RPU cells can have synaptic weights implemented using various types of tunable resistive devices including, for example, memristive devices, capacitors/read transistors, etc.

SUMMARY

Embodiments of the invention include RPU cell architectures for RPU devices, wherein an RPU cell comprises a single weight storage capacitor and a plurality of weight update and read circuit blocks which have shared access to the single weight storage capacitor and which are configured to perform weight read and update operations in parallel using the single weight storage capacitor. For example, in one embodiment, a device comprises a RPU cell. The RPU cell comprises a weight storage device configured to store a weight voltage which represents a weight value of the RPU cell, and a plurality of circuit blocks. Each circuit block comprises a weight update circuit coupled to dedicated update control lines, and a weight read circuit coupled to dedicated read control lines. The RPU cell is configured to enable shared access to the weight storage device by the plurality of circuit blocks. The plurality of circuit blocks are configured to operate in parallel to perform separate weight read operations in which each read circuit is configured to generate a read current based on the stored weight voltage of the RPU cell, and output the read current on the dedicated read control lines of the read circuit. The plurality of circuit blocks are configured to operate in parallel to perform separate weight update operations in which each weight update circuit is configured to receive respective update control signals on the dedicated update control lines, generate an update current based on the respective update control signals, and apply the update current to the weight storage device to adjust the stored weight voltage based on the update current.

Another embodiment includes a device which comprises an array of RPU cells, a plurality of weight update control lines coupled to each RPU cell in the array, a plurality of weight read control lines coupled to each RPU cell in the array, and control circuitry configured to control the array of RPU cells, wherein the control circuitry is configured to (i) generate read control signals that are applied to the read control lines to read weights of the RPU cells, and (ii) generate weight update control signals that are applied to the update control lines to update weights of the RPU cells. Each RPU cell in the array of RPU cells comprises a plurality of circuit blocks, wherein each circuit block comprises a weight update circuit coupled to dedicated update control lines, and a weight read circuit coupled to dedicated read control lines, and a weight storage device configured to store a weight voltage which represents a weight value of the RPU cell. Each RPU cell is configured to enable shared access to the weight storage device by the plurality of circuit blocks of the RPU cell. The circuit blocks in a given RPU cell are configured to operate in parallel to perform separate weight read operations in which each read circuit of the given RPU cell is configured to generate a read current based on the stored weight voltage of the RPU cell, and output the read current on the dedicated read control lines of the read circuit. In addition, the circuit blocks in the given RPU cell are configured to operate in parallel to perform separate weight update operations in which each weight update circuit of the given RPU cell is configured to receive respective update control signals on the dedicated update control lines, generate an update current based on the respective update control signals, and apply the update current to the weight storage device to adjust the stored weight voltage based on the update current.

Another embodiment includes a method for training a convolution layer of a neural network using an array of RPU cells. Kernel values of a convolutional kernel are mapped to an array of resistive processing unit (RPU) cells which represents a convolutional layer of a neural network, wherein each RPU cell comprises (i) a weight storage device configured to store a weight voltage which represents a kernel value of the convolutional kernel, and (ii) a plurality of circuit blocks, wherein each circuit block comprises a weight update circuit coupled to dedicated update control lines, and a weight read circuit coupled to dedicated read control lines. A plurality of different input volumes input to the array of RPU cells to perform a training process, wherein a number of the different input volumes equals a number of the circuit blocks of each RPU cell. A training process is performed to train the kernel values of the convolutional kernel. The training process comprises concurrently applying the convolutional kernel to each of the different input volumes in parallel by (i) performing separate weight read operations in parallel in each RPU cell wherein each read circuit is configured to generate a read current based on the stored weight voltage of the RPU cell, and output the read current on the dedicated read control lines of the read circuit, and (ii) performing separate weight update operations in parallel in each RPU cell wherein each weight update circuit is configured to receive respective update control signals on the dedicated update control lines, generate an update current based on the respective update control signals, and apply the update current to the weight storage device to adjust the stored weight voltage based on the update current. Each corresponding circuit block in each RPU cell processes a corresponding one of the input volumes.

Other embodiments will be described in the following detailed description of embodiments, which is to be read in conjunction with the accompanying figures.

DETAILED DESCRIPTION OF EMBODIMENTS

Embodiments of the invention will now be discussed in further detail with regard to RPU frameworks which allow for efficient implementation of a convolutional layer of a convolutional neural network (CNN) that is configured to process a plurality of different input volumes in parallel. In particular, an RPU system according to an exemplary embodiment of the disclosure comprises an array of RPU cells, wherein each RPU cell comprises a single weight storage capacitor and a plurality of weight update and read circuit blocks which have shared access to the single weight storage capacitor and which perform weight read and update operations in parallel using the single weight storage capacitor. In the context of a convolutional layer of a CNN, the weight storage capacitors of the RPU cells store values for kernels that are used to filter the input volumes during, e.g., an training process, wherein the RPU framework allows each kernel to be concurrently applied to a plurality of different input volumes in parallel to perform forward, backward and weight update cycles of a backpropagation process for the plurality of different input volumes at the same time. In other words, RPU architectures according to embodiments of the disclosure effectively allow the same kernel matrix to be concurrently applied to a plurality of different input volumes at the same time to provide increased performance in the processing speed of the RPU array for training a CNN.

Figure 1:
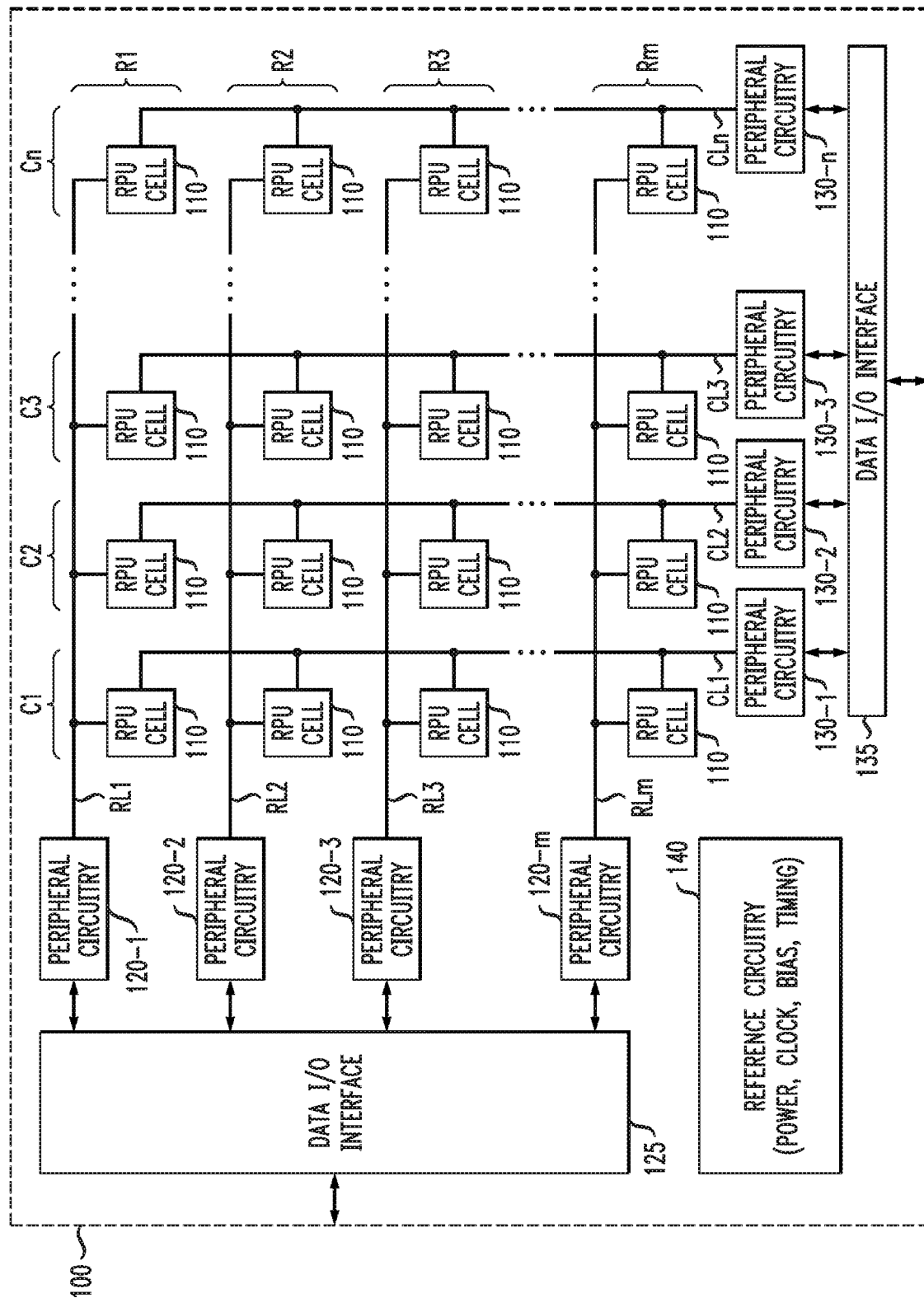
FIG. 1 schematically illustrates an RPU system which can be implemented using RPU cell architectures according to embodiments of the invention.

FIG. 1 schematically illustrates an RPU system 100 which can be implemented using RPU cell architectures according to embodiments of the invention. The RPU system 100 comprises a two-dimensional (2D) crossbar array of RPU cells 110 arranged in a plurality of rows R1, R2, R3, ..., Rm, and a plurality of columns C1, C2, C3, ..., Cn. The RPU cells 110 in each row R1, R2, R3, ..., Rm are commonly connected to respective row control lines RL1, RL2, RL3, ..., RLm (collectively, row control lines RL). The RPU cells 110 in each column C1, C2, C3, ..., Cn are commonly connected to respective column control lines CL1, CL2, CL3, ..., CLn (collectively, column control lines CL). Each RPU cell 110 is connected at (and between) a cross-point (or intersection) of a respective one of the row and column control lines. In one example embodiment, the RPU system 100 comprises a 4,096×4,096 array of RPU cells 110.

The RPU system 100 further comprises separate blocks of peripheral circuitry 120-1, 120-2, 120-3, ..., 120-$m$ (collectively, peripheral circuitry 120) connected to respective row control lines RL1, RL2, RL3, ..., RLm, as well as separate blocks of peripheral circuitry 130-1, 130-2, 130-3, ..., 130-$n$ (collectively, peripheral circuitry 130) connected to respective column control lines CL1, CL2, CL3, ..., CLn. Further, each block of peripheral circuitry 120-1, 120-2, 120-3, ..., 120-$m$ (for the rows) is connected to a data input/output (I/O) interface block 125. Similarly, each block of peripheral circuitry 130-1, 130-2, 130-3, ..., 130-$n$ (for the columns) is connected to a data I/O interface block 135. The RPU system 100 further comprises reference circuitry 140 which comprises various types of circuit blocks such as power, clock, bias and timing circuitry to provide power distribution and control signals and clocking signals for operation of the RPU system 100.

In some embodiments, the RPU system 100 is configured to perform DNN or CNN computations wherein a conductance of each RPU cell 110 represents a matrix element or weight $w_{ij}$, which can be updated or accessed through operations of the peripheral circuitry 120 and 130 (wherein $w_{ij}$ denotes a weight value for the $i^{th}$ row and the $j^{th}$ column in the array of RPU cells 110). As noted above, DNN training generally relies on a backpropagation process which comprises three repeating cycles: a forward cycle, a backward cycle, and a weight update cycle. The RPU system 100 can be configured to perform all three cycles of the backpropagation process in parallel, thus potentially providing significant acceleration in DNN training with lower power and reduced computation resources. The RPU system 100 can be configured to perform vector-matrix multiplication operations in the analog domain in a parallel manner, which leads to a significant enhancement in performance (e.g., 10K× or more) as compared to a counterpart CPU/GPU implementation.

While the row control lines RL and column control lines CL are each shown in FIG. 1 as a single line for ease of illustration, it is to be understood that each row and column control line can include two or more control lines connected to the RPU cells 110 in the respective rows and columns, depending on the implementation. For example, in one embodiment, each row control line RL and each column control line CL comprises a pair of control lines, including an "Update" control line, and a "Read" control line, wherein the cell conductance (e.g., weight value) of a given RPU cell 110 can be adjusted and sensed through the Update and Read control lines, respectively, for a given row and column connected to the given RPU cell 110.

In some embodiments, each block of peripheral circuitry 120 and 130 comprises essentially the same set of circuit blocks connected to the respective rows and columns in the 2D array of RPU cells 110 to perform forward, backward and update operations for a backpropagation process. For example, in one embodiment, to support an RPU cell update operation (e.g., update a weight value of given RPU cell 110), each block of peripheral circuitry 120 and 130 comprises a stochastic pulse generator block and an update pulse driver block, which are responsive to update vectors that are received during a weight update cycle, to generate and apply a series of stochastically populated pulses to coincidence detection circuitry (within a given RPU cell 110) and perform operations to update the weight value of the given RPU cell 110. In particular, as discussed in further detail below, the stochastic pulses are transmitted on the Update row and Update column control lines connected to the given RPU cell 110 and processed using coincidence detection circuitry to perform various operations (e.g., multiplication) for updating a stored weight value within the RPU cell 110.

In addition, in one embodiment, to support RPU cell read/sensing operations (e.g., read a weight value of given RPU cell 110), each block of peripheral circuitry 120 and 130 comprises (i) a pulse-width modulation (PWM) circuit and read pulse driver circuit to generate and apply PWM read pulses to the RPU cells 110, in response to input vector values (read input values) received during forward/backward cycles, and (ii) a current integrator circuit and analog-to-digital (ADC) circuit to integrate read currents ($I_{READ}$) which are output and accumulated from the connected RPU cells 110 and convert the integrated currents into digital values (read output values) for subsequent computation.

The data I/O interface 125 provides an interface that is configured to (i) receive external control signals and apply update and read input values to the blocks of peripheral circuitry 120, and (ii) receive digital read output values from the blocks of peripheral circuitry 120, and send the digital read output signals to a remote element for processing. Similarly, the data I/O interface 135 provides an interface that is configured to (i) receive external control signals and apply update and read input values to the blocks of peripheral circuitry 130, and (ii) receive digital read output values from the blocks of peripheral circuitry 130, and send the digital read output signals to a remote element for processing.

Each RPU cell 110 in the RPU system 100 comprises a resistor-like circuit component with a tunable conductance, wherein the conductance value of each RPU cell 110 represents a matrix element or weight. For example, in some embodiments, the RPU cells 110 can be implemented using a variable resistance device such as a resistive memory element used in resistive random-access memory (RRAM) systems. In particular, as is known in the art, a resistive memory cell comprises a metal-insulator-metal (MIM) structure in which the insulator layer (e.g., metal-oxide) exhibits a variable resistance through a resistive switching behavior.

In other embodiments, the RPU cells 110 can be implemented using an analog CMOS framework comprising a capacitor and one or more read transistors, wherein the capacitor serves as a memory element in the RPU cell which stores a weight value in the form of capacitor voltage. As explained in further detail below, the capacitor voltage, or weight voltage $V_W$, is directly applied to the gate terminal(s) of the read transistor(s) to modulate the channel resistance of the read transistor(s). The charge state stored in the capacitor can be accessed by applying a small bias across the read transistor(s) to generate drain currents, which generate a read current, $I_{READ}$, which flows out of the RPU cell and is processed in the respective blocks of peripheral circuitry 120 and 130.

As is known in the art, fully connected DNNs comprise stacks of fully connected layers such that a signal propagates from an input layer to an output layer by going through series of linear and non-linear transformations. The entire DNN expresses a single differentiable error function that maps the input data to class scores at the output layer. Typically, a DNN is trained using a simple stochastic gradient decent (SGD) scheme, in which an error gradient with respect to each parameter is calculated using the backpropagation algorithm. The backpropagation algorithm is composed of three cycles, forward, backward and weight update that are repeated many times until a convergence criterion is met. The forward and backward cycles mainly involve computing vector-matrix multiplication operations in forward and backward directions using the 2D crossbar array of RPU device cells 110 of the RPU system shown in FIG. 1.

Figure 2:
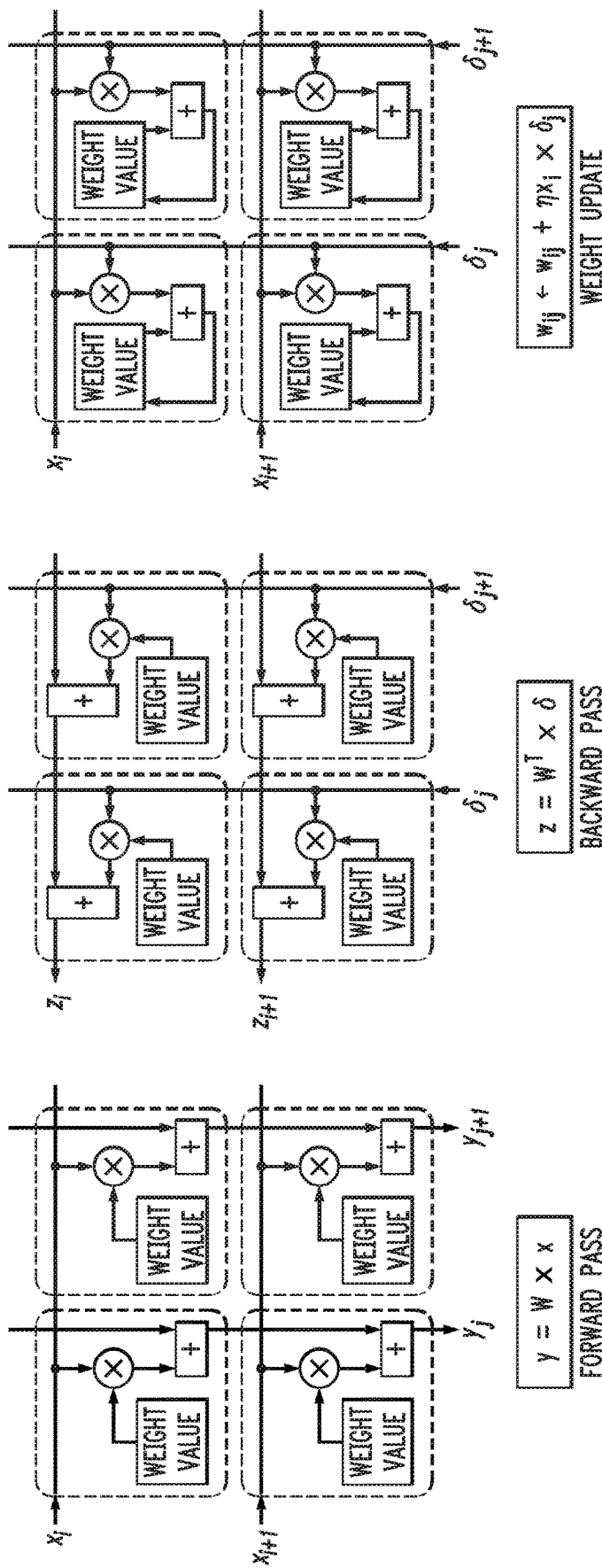
FIG. 2A schematically illustrates a forward pass operation of a backpropagation process, which can be performed using the RPU system of FIG. 1.
FIG. 2B schematically illustrates a backward pass operation of a backpropagation process, which can be performed using the RPU system of FIG. 1.
FIG. 2C schematically illustrates a weight update operation of a backpropagation process, which can be performed using the RPU system of FIG. 1.

In the RPU system 100 of FIG. 1, the conductance values $g_{ij}$ in the 2D crossbar array of RPU cells form a matrix W of weight values $w_{ij}$. In a forward cycle (FIG. 2A), an input vector (in the form of voltage pulses) is transmitted through each of the input rows in the 2D crossbar array to perform a vector-matrix multiplication in the RPU cells 110. In a backward cycle FIG. 2B), voltage pulses supplied from the columns are input to the RPU cells 110, and a vector-matrix product is computed on the transpose of the weight matrix W values. In contrast to forward and backward cycles, implementing the weight update on a 2D crossbar array of resistive devices requires calculating a vector-vector outer product which consists of a multiplication operation and an incremental weight update to be performed locally at each cross-point RPU device in the array. FIGS. 2A, 2B, and 2C schematically illustrate respective forward pass, backward pass, and weight update operations of a backpropagation algorithm which can be performed using the RPU system 100 of FIG. 1.

For a single fully connected layer where N input neurons are connected to M output (or hidden) neurons, the forward pass (FIG. 2A) involves computing a vector-matrix multiplication y=Wx, where the vector x of length N represents the activities of the input neurons and the matrix W of size M×N stores the weight values between each pair of input and output neurons. The resulting vector y of length M is further processed by performing a non-linear activation on each of the elements and then passed to the next layer. Once the information reaches the final output layer, an error signal is calculated and back propagated through the network. In the forward cycle, the stored conductance values in the crossbar array of RPU cells 110 form a matrix, whereas the input vector is transmitted as voltage pulses through each of the input rows R1, R2, R3, . . . , Rm.

The backward cycle (FIG. 2B) on a single layer also involves a vector-matrix multiplication on the transpose of a weight matrix, $z=W^T\delta$, where W denotes the weight matrix, where the vector $\delta$ of length M represents the error calculated by the output neurons, and where the vector z of length N is further processed using the derivative of neuron non-linearity and then passed down to the previous layers. In a backward cycle, voltage pulses are supplied to the RPU cells 110 from columns CL1, CL2, CL3, . . . , CLn as an input, and the vector-matrix product is computed on the transpose of the weight matrix W.

Finally, in an update cycle (FIG. 2C), the weight matrix W is updated by performing an outer product of the two vectors that are used in the forward and the backward cycles. In particular, implementing the weight update on a 2D crossbar array of resistive devices locally and all in parallel, independent of the array size, requires calculating a vector-vector outer product which consists of a multiplication operation and an incremental weight update to be performed locally at each cross-point (RPU cell 110) in the RPU system of FIG. 1. As schematically illustrated in FIG. 2C, the weight update process is computed as: $w_{ij} \leftarrow w_{ij} + \eta x_i \times \delta_j$, where $w_{ij}$ represents the weight value for the $i^{th}$ row and the $j^{th}$ column (for simplicity layer index is omitted), where $x_i$ is the activity at the input neuron, $\delta_j$ is the error computed by the output neuron, and where $\eta$ denotes a global learning rate.

In summary, all operations on the weight matrix W can be implemented with using the 2D crossbar array of two-terminal RPU device with M rows and N columns where the stored conductance values in the crossbar array form the matrix W. In the forward cycle, input vector x is transmitted as voltage pulses through each of the rows and the resulting vector y can be read as current signals from the columns. Similarly, when voltage pulses are supplied from the columns as an input in the backward cycle, then a vector-matrix product is computed on the transpose of the weight matrix $W^T$. Finally, in the update cycle, voltage pulses representing vectors x and $\delta$ are simultaneously supplied from the rows and the columns. In the update cycle, each RPU cell 110 performs a local multiplication and summation operation by processing the voltage pulses coming from the column and the row and hence achieving an incremental weight update.

To determine the product of the xi and $\delta$j vectors for the weight update cycle, stochastic translator circuitry in the peripheral circuit blocks 120 and 130 is utilized to generate stochastic bit streams that represent the input vectors xi and $\delta$j. The stochastic bits streams for the vectors xi and $\delta$j are fed through rows and columns in the 2D crossbar array of RPU cells, wherein the conductance of a given RPU cell will change depending on the coincidence of the xi and $\delta$j stochastic pulse streams input to the given RPU cell. The vector cross product operations for the weight update operation are implemented based on the known concept that that coincidence detection (using an AND logic gate operation) of stochastic streams representing real numbers is equivalent to a multiplication operation.

All three operating modes described above allow the RPU cells forming the neural network to be active in all three cycles and, thus, enable a very efficient implementation of the backpropagation algorithm to compute updated weight values of the RPU cells during a DNN training process. As noted above, a stochastically trained DNN comprising arrays of RPU cells can have synaptic weights implemented using various types of tunable resistive devices including, for example, memristive devices, capacitors/read transistors, etc.

Figure 3:
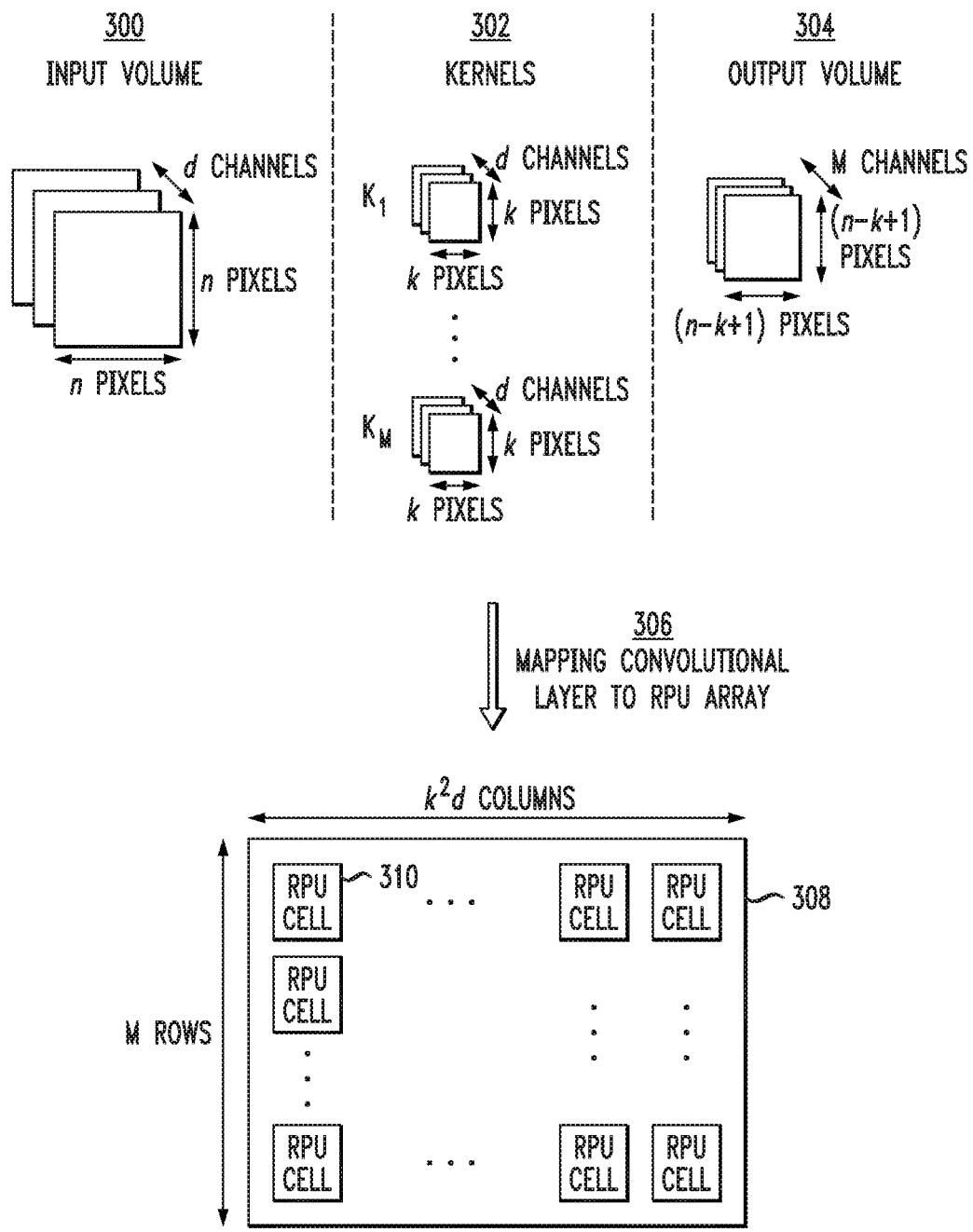
FIG. 3 schematically illustrates a process for performing kernel convolution using a convolution layer of a convolutional neural network wherein the convolutional layer is mapped to array of RPU devices.

FIG. 3 schematically illustrates process for performing kernel convolution using a convolution layer of a convolutional neural network, wherein the convolutional layer is mapped to array of RPU devices. In particular, FIG. 3 schematically illustrates an input volume 300, a plurality of kernels 302 (e.g., $K_1$, . . . , $K_M$), an output volume 304, wherein the parameters of the kernels 302 are mapped 306 to an RPU array 308 comprising a 2D array of RPU cells 310. The input volume 300 to the convolutional layer can be an image or an output of a previous convolutional layer, wherein the input volume has dimensions of (n, n, d) with a width and height of n pixels and a depth of d channels corresponding to different components of the input volume 300 (e.g. red, green and blue (RGB) components of an colored image). By way of example, the input volume 300 may be an image comprising a matrix of 256=256 (Width Height) pixels, wherein each pixel comprises a pixel value within a range of pixels values that are encoded based on the bit size of the pixel (e.g., an 8-bit pixel can have a value in a range of [0, 255]). With a colored image (e.g., RGB-based images), the addition of separate color channels (e.g., y=3 color channels for RGB images) introduces an additional depth field to the input volume (e.g., 3D input data value). In this regard, the input volume 300 may be a 3D data structure with a dimension of 256×256×3.

The convolution kernels 302 comprise filters that are applied to the input volume 300. In the exemplary embodiment shown in FIG. 3, each kernel $K_1$-$K_M$ comprises a 3D volume comprising a 2D matrix of k×k kernel values and a depth of d channels, one kernel channel for each of the different channels (e.g., color planes) of the input volume 300. In practice, a kernel is a smaller-sized matrix in comparison to the dimensions of the input volume 300. For example, assuming the input volume 300 is a 3D data structure with a dimension of 256/256/3, each kernel $K_1$-$K_M$ may have a dimension of 16×16×3. Each kernel $K_1$-$K_M$ is convolved with the input volume 300 to obtain the output volume 304, which comprises M channels (or M "feature maps"). Each feature map indicates regions where features specific to the given kernel have been detected in the input volume. The values of each kernel matrix will change with each learning iteration over a training set, indicating that the CNN is learning to identify which regions are of significance for extracting features from the input data.

During a forward cycle, a 2D convolution operation is performed whereby each kernel $K_1$-$K_M$ slides over the input volume 300 across the width and height and a dot product is computed between the parameters of the kernels and the input pixels in each in local region (or patch) of the input volume. Assuming no "zero padding" and single pixel sliding (stride is equal to one), the 2D convolution operation results in a single output plane with dimensions ((n−k+1), 1) for each kernel. While the convolution operation is separately performed between each corresponding channel of the input volume 300 and a given kernel (e.g., three color planes RGB), the separate convolution results for each channel (or plane) are added to produce a single output value in the feature map generated as a result of the given kernel. When there are M different kernels applied to the input volume 300, the output volume 304 comprises M channels (or M feature maps) each with size (n−k+1) such that the output volume 304 has a dimension of ((n−k+1), M).

By way of example, assuming a kernel size of 16×16, the convolution operation involves taking 16×16 blocks of pixels (patches) from the input volume and convolving (i.e., calculating the dot product) the values in the patch and the values of a given kernel matrix. A convolved value obtained by summing the resultant terms from the dot product generates a single entry in the feature map for the given kernel matrix. The patches are determined by iteratively sliding the kernel by a certain amount (referred to as stride length) over the input volume matrix towards the right, or downwards when the boundary of the matrix is reached, and performing a convolution process for each new patch that is overlapped by the kernel, and repeating this process until the entire input volume 300 has been processed by each kernel 302.

The output volume 304 is passed to following layers of the CNN for further processing. During a backward cycle of the convolutional layer, similar operations are performed but where spatially flipped kernels slide over the error signals that are back propagated from the upper layers. The error signals form a volume with the same dimensions of the output ((n−k+1), M). The results of the backward convolution are organized into a volume with dimensions (n, n, d) and are further back propagated for error calculations in previous layers. Finally, in the update cycle, a gradient with respect to each parameter is computed by convolving the input volume with the error volume used in the forward and backward cycles, respectively. This gradient information, which has the same dimensions as the kernels, is added to the kernel parameters after scaled with a learning rate.

For an efficient implementation of a convolutional layer using an RPU array, all the input/output volumes as well as the kernel parameters need to be rearranged in a specific way. The convolution operation essentially performs a dot product between the kernel parameters and a local region of the input volume and hence can be formulated as a matrix-matrix multiply. By collapsing the parameters of a single kernel to a column vector of length $k^2d$ and stacking each of the M kernels as separate rows, a parameter matrix K of size $M \times k^2d$ is formed which stores all of the trainable parameters associated a single convolutional layer, as shown in FIG. 3. After this rearrangement, in the forward cycle, the outputs corresponding to a specific location along the width and height of the input volume 300 are calculated by performing a vector-matrix multiplication y=Kx, where the vector x of length $k^2d$ is a local region in the input volume 300 and vector y of length M has all the results along the depth of the output volume. By repeating this vector-matrix multiplication for different local regions (i.e., patches), the full volume of the output map can be computed. Indeed, this repeated vector-matrix multiplication is equivalent to a matrix-matrix multiplication Y=KX, where the matrix X with dimensions $[k^2d \times (n-k+1)^2]$ has the input neuron activities with some repetition and the resulting matrix Y with dimensions $[M \times (n-k+1)^2]$ has all the results corresponding to the output volume 304. Similarly, using the transpose of the parameter matrix, the backward cycle of a convolutional layer can also be expressed as a matrix-matrix multiplication $Z=K^TD$, where the matrix D with dimensions $[M \times (n-k+1)^2]$ has the error signals corresponding to an error volume. Furthermore, in this framework, the update cycle also simplifies to a matrix multiplication where the gradient information for the entire parameter matrix K can be computed using matrices X and D, and the update process can be written as $K \leftarrow K + \eta(DX^T)$.

The rearrangement of the trainable parameters to a single matrix K by flattening of the kernels enables an efficient implementation of a convolutional layer using the RPU array 308. After this rearrangement, all the matrix operations performed on K can be computed as a series of vector operations on the RPU array 308. Analogous to the fully connected layers, matrix K is mapped to an RPU array with M rows and $k^2d$ columns as shown in FIG. 3. In the forward cycle, the input vector corresponding to a single column in X is transmitted as voltage pulses from the columns and the results are read from the rows. Repetition of this operation for all $(n-k+1)^2$ columns in n X completes all the computations required for the forward cycle. Similarly, in the backward cycle, the input vector corresponding to a single column in D is serially fed to the rows of the array. The update process $K \leftarrow K + \eta(DX^T)$ can be viewed as a series of updates that involves computing an outer product between two columns from X and D. This can be achieved by serially feeding the columns of X and D simultaneously to the RPU array 308. During the update cycle, each RPU cell 310 performs a series of local multiplication and summation operations and hence calculates the product of the two matrixes.

As noted above, a convolution operation essentially performs dot products between the kernels and the local regions (patches) of the input volume. A common implementation pattern of a convolutional layer is to take advantage of this fact and formulate the forward pass of a convolutional layer as one large matrix multiplication as follows. The local regions (patches) in the input volume 300 are stretched out (flattened) into columns in an operation known as im2col. For example, if the input is [n×n×d] and it is to be convolved with k×k×d kernels at stride 1, then we would take different [k×k×d] blocks of pixels (patches) in the input volume 300 and stretch each patch into a column vector of size $k^2d$. Iterating this process in the input at stride of 1 gives (n−k+1) locations along both width and height of the input volume 300, leading to an output matrix Xcol of im2col of size $[(k^2d) \times (n-k+1)^2]$, where every column is a stretched out receptive field and there are $(n-k+1)^2$ in total. Note that since the receptive fields overlap, every number in the input volume may be duplicated in multiple distinct columns.

The weights of the CONV layer are similarly stretched out into rows. For example, if there are M filters of size [k×k×d] this would give a matrix Wrow of size $[M \times k^2d]$. The result of a convolution is now equivalent to performing one large matrix multiply np.dot (Wrow, Xcol), which evaluates the dot product between every filter and every receptive field location. In our example, the output of this operation would be $[M \times (n-k+1)^2]$, giving the output of the dot product of each filter at each location. This function returns the dot product of two arrays. For 2-D vectors, it is the equivalent to matrix multiplication. For 1-D arrays, it is the inner product of the vectors. The result is reshaped back to its proper output dimension $[(n-k+1) \times (n-k+1) \times M]$. It is to be noted that the exemplary embodiment of FIG. 3 with regard to the convolution layer with no "zero" padding and single pixel sliding is only used for illustrative purposes. However, the proposed mapping is more general and can be applied to convolutional layers with zero padding, strides larger than a single pixel, dilated convolutions or convolutions with non-square inputs or kernels. While such options are possible, a stretched out matrix is very large and not very efficient.

In the exemplary embodiments described above, the RPU array can be implemented using an analog cross-bar array framework in which each RPU cell comprises a capacitor (referred to as weight storage capacitor) which serves as an analog memory element to store a weight value of the RPU cell. In a conventional RPU framework in which the RPU cells implement an analog CMOS-based framework using, e.g., weight storage capacitors and read transistors for storing and reading RPU cell weight values, each RPU cell would have a single weight storage capacitor and corresponding circuitry for reading and updating the weight value of the weight storage capacitor. When implementing a convolution layer of a CNN with such RPU framework, the time required to forward pass an entire input volume (e.g., input image) through the RPU crossbar array would be approximately N2*Integration time, where N is the linear number of pixels assuming a stride of one. As the value N increases, the amount of time to complete the forward pass operation can become prohibitive for implementing an analog RPU system.

Embodiments of the disclosure as discussed below provide RPU frameworks which enable the implementation of a convolutional layer of a neural network that is configured to process a plurality of different input volumes in parallel. In particular, an RPU system comprises an array of RPU cells, wherein each RPU cell comprises a single weight storage capacitor and a plurality of weight update and read circuit blocks which have shared access to the single weight storage capacitor and which perform weight read and update operations in parallel using the single weight storage capacitor. In the context of a convolutional layer of a CNN, the weight storage capacitors of the RPU cells store kernel values for kernels that are used to filter the input volumes, and the RPU framework allows each kernel to be concurrently applied to a plurality of different input volumes (e.g., 4 different patches) in parallel to perform the forward, backward and weight update cycles of a backpropagation process for the plurality of different input volumes at the same time. In other words, the RPU architecture effectively allows the same kernel matrix to be concurrently applied to a plurality of different input volumes at the same time to provide increased performance in the processing speed of the RPU array for training a CNN.

Figure 4:
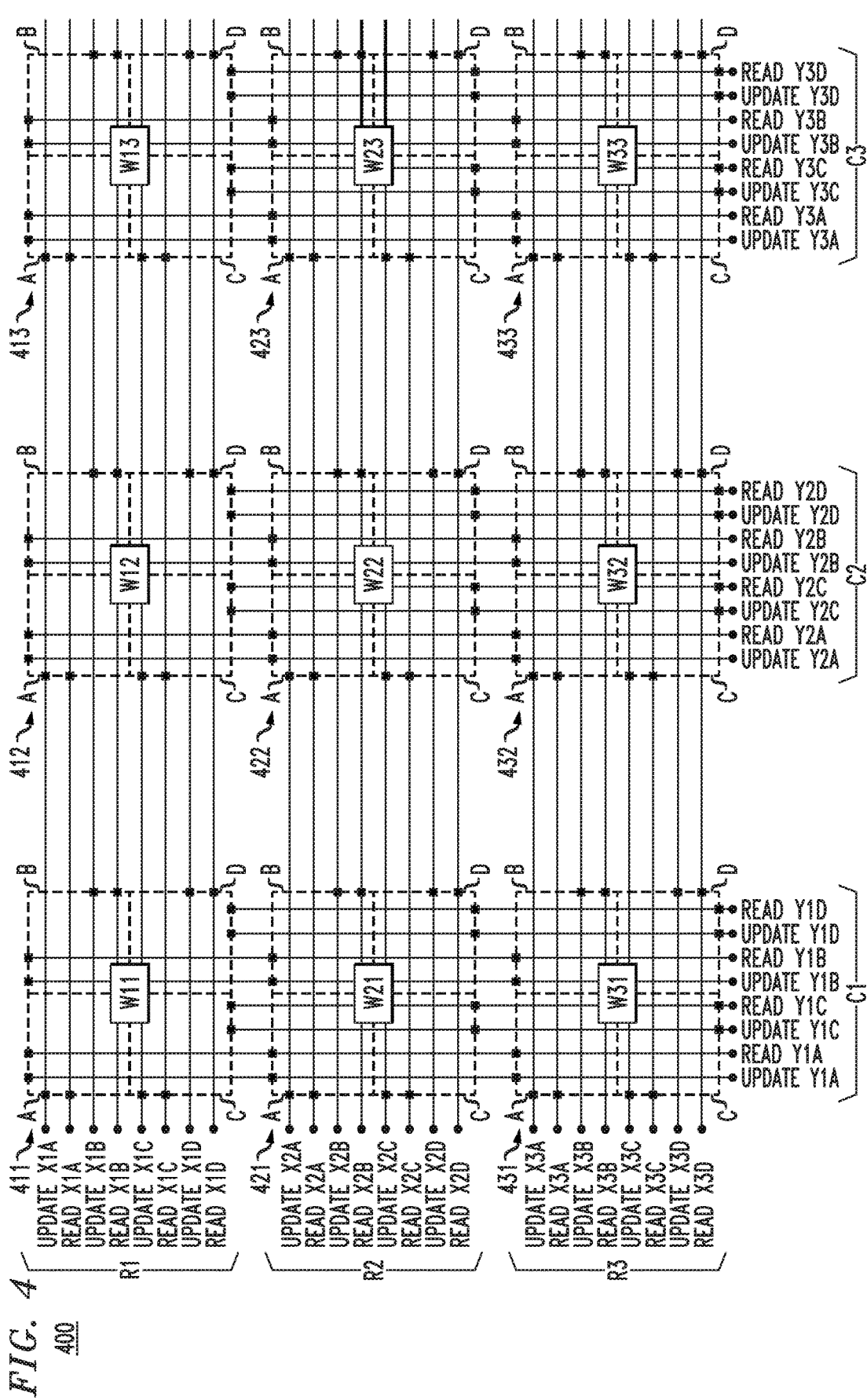
FIG. 4 schematically illustrates an array of RPU cells, wherein each RPU cell comprises a single weight storage capacitor and a plurality of weight update and read circuit blocks which have shared access to the single weight storage capacitor to perform weight read and update operations in parallel using the single weight storage capacitor, according to an exemplary embodiment of the disclosure.

For example, FIG. 4 schematically illustrates an RPU array 400 comprising an array of RPU cells, wherein each RPU cell comprises a single weight storage capacitor and a plurality of weight update and read circuit blocks which have shared access to the single weight storage capacitor to perform weight read and update operations in parallel using the single weight storage capacitor, according to an exemplary embodiment of the disclosure. In particular, as shown in FIG. 4, the RPU array 400 comprises a plurality of RPU cells 411, 412, 413, 421, 422, 422, 431, 432, and 433 having respective weight storage capacitors W11, W12, W13, W21, W22, W23, W31, W32, W33. For ease of illustration, FIG. 4 shows nine RPU cells in three rows R1, R2, and R3, and three columns C1, C2, and C3 of the RPU array, although it is to be understood that the RPU array 400 would include additional rows and columns of RPU cells and that the rows R1, R2, and R3 and columns C1, C2, and C2 would include more than three RPU cells.

Each RPU cell 411, 412, 413, 421, 422, 422, 431, 432, and 433 comprises four separate circuit blocks A, B, C and D. Each circuit block A, B, C and D comprises weight update and read circuitry. The circuit blocks A, B, C and D in a given RPU cell have shared access to the single weight storage capacitor of the given RPU cells. For example, the circuit blocks A, B, C and D of the RPU cell 411 have shared access to the weight storage capacitor W11 of the RPU cell 411. An exemplary embodiment of the circuit blocks A, B, C and D of the RPU cells will be discussed in further detail below in conjunction with FIG. 5.

As further shown in FIG. 4, the row control lines in each row R1, R2, and R3 comprise four pairs of row control lines, wherein each pair of row control lines in a given row is connected to a corresponding one of the circuit blocks A, B, C and D of all RPU cells within the given row. Similarly, the column control lines in each column C1, C2, and C3 comprise four pairs of column control lines, wherein each pair of column control lines in a given column is connected to a corresponding one of the circuit blocks A, B, C and D of all RPU cells within the given column. In one exemplary embodiment, the row control lines are patterned on an upper metallization level of the RPU crossbar array, and the column control lines are patterned on lower metallization level of the RPU crossbar array.

For example, as shown in FIG. 4, the first row R1 comprises four pairs of dedicated row update/read control lines [Update_X1A/Read_X1A], [Update_X1B/Read_X1B], [Update_X1C/Read_X1C], and [Update_X1D/Read_X1D], which are connected to respective circuit blocks A, B, C and D of the RPU cells 411, 412, and 413 in the first row R1. The second row R2 comprises four pairs of dedicated row update/read control lines [Update_X2A/Read_X2A], [Update_X2B/Read_X2B], [Update_X2C/Read_X2C], and [Update_X2D/Read_X2D], which are connected to respective circuit blocks A, B, C and D of the RPU cells 421, 422, and 423 in the second row R2. The third row R3 comprises four pairs of dedicated row update/read control lines [Update_X3A/Read_X3A], [Update_X3B/Read_X3B], [Update_X3C/Read_X3C], and [Update_X3D/Read_X3D], which are connected to respective circuit blocks A, B, C and D of the RPU cells 431, 432, and 433 in the third row R3.

In addition, the first column C1 comprises four pairs of dedicated column update/read control lines [Update_Y1A/Read_Y1A], [Update_Y1B/Read_Y1B], [Update_Y1C/Read_Y1C], and [Update_Y1D/Read_Y1D], which are connected to respective circuit blocks A, B, C and D of the RPU cells 411, 421, and 431 in the first column C1. The second column C2 comprises four pairs of dedicated column update/read control lines [Update_Y2A/Read_Y2A], [Update_Y2B/Read_Y2B], [Update_Y2C/Read_Y2C], and [Update_Y2D/Read_Y2D], which are connected to respective circuit blocks A, B, C and D of the RPU cells 412, 422, and 432 in the second column C2. The third column C1 comprises four pairs of dedicated column update/read control lines [Update_Y3A/Read_Y3A], [Update_Y3B/Read_Y3B], [Update_Y3C/Read_Y3C], and [Update_Y3D/Read_Y3D], which are connected to respective circuit blocks A, B, C and D of the RPU cells 412, 423, and 433 in the third column C3.

The single weight value (e.g., voltage of weight storage capacitor) of a given RPU cell can be read and updated by any one of the circuit blocks A, B, C and D of the given RPU cell through the pairs of read/update control lines connected to the circuit blocks A, B, C and D. For example, the weight W11 of the RPU cell 411 can be read through the Read_X1A and Read_Y1A control lines connected to the circuit block A of the RPU cell 411, and updated through the Update_X1A and Update_Y1A control lines connected to the circuit block A of the RPU cell 411. In addition, the weight W11 of the RPU cell 411 can be read through the Read_X1B and Read_Y1B control lines connected to the circuit block B of the RPU cell 411, and updated through the Update_X1B and Update_Y1B control lines connected to the circuit block B of the RPU cell 411. Further, the weight W11 of the RPU cell 411 can be read through the Read_X1C and Read_Y1C control lines connected to the circuit block C of the RPU cell 411, and updated through the Update_X1C and Update_Y1C control lines connected to the circuit block C of the RPU cell 411.

In the context of a CNN, the RPU array 400 can be configured as a convolutional layer of the CNN, wherein the weight storage capacitors W11, W12, W13, W21, W22 W23, W31, W32, and W33 of the respective RPU cells 411, 412, 413, 421, 422, 423, 431, 432, and 433 store kernel values for kernels that are used to filter input volumes. In the exemplary embodiment of FIG. 4 where each RPU cell comprises 4 separate circuit blocks A, B, C and D, the RPU array 400 can perform kernel convolutions operations concurrently on 4 different input volumes (e.g., different patches of an input volume). In particular, the circuit blocks A of the RPU cells can process a first input volume, the circuit blocks B of the RPU cells can process a second input volume, the circuit blocks C of the RPU cells can process a third input volume, and the circuit blocks D of the RPU cells can process a fourth input volume. In this regard, the RPU framework of FIG. 4 allows the same kernel to be concurrently applied to 4 different input volumes (e.g., 4 different patches) in parallel to perform the forward, backward and weight update cycles of a backpropagation process for the 4 different input volumes at the same time.

Figure 5:
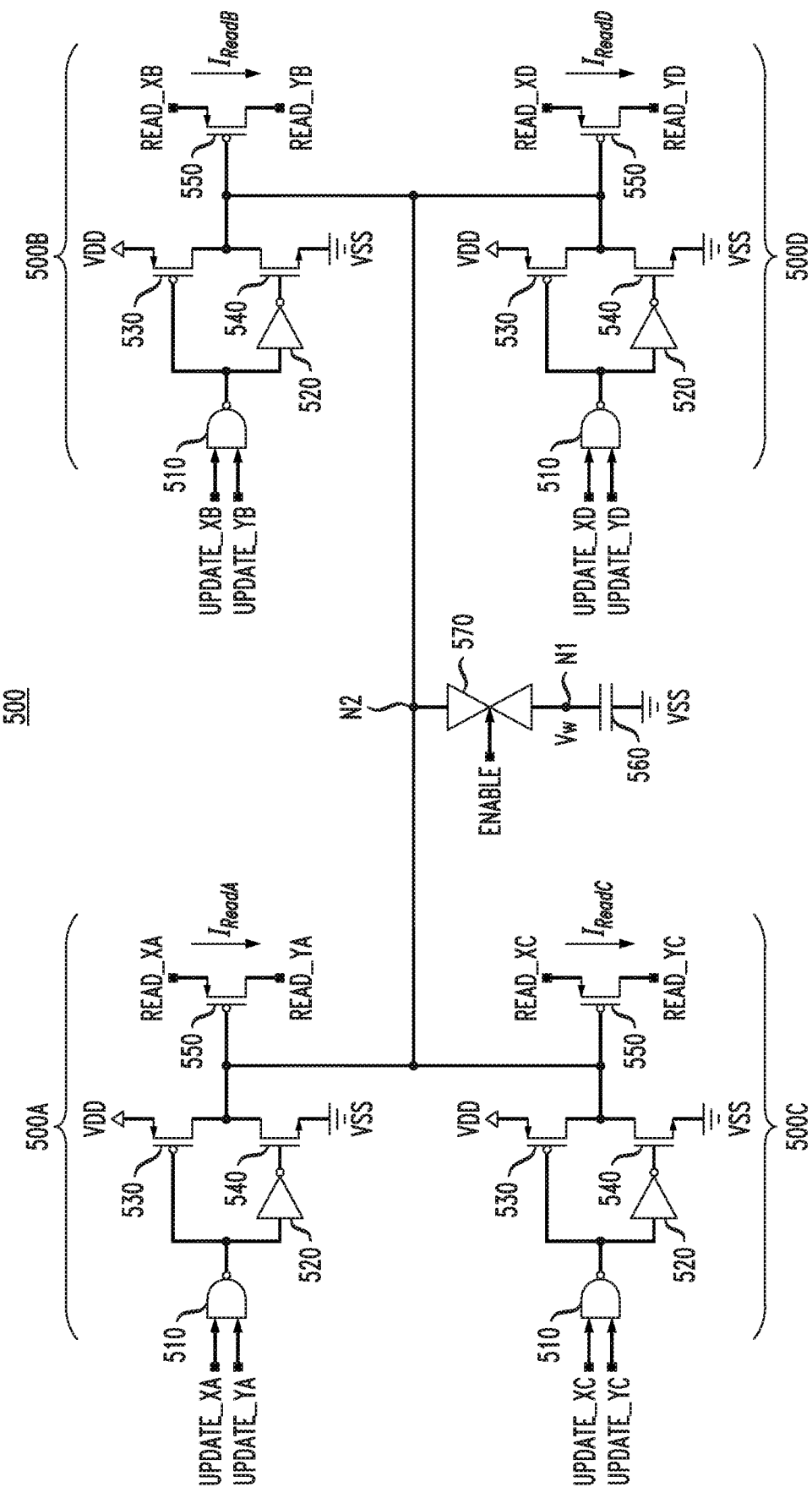
FIG. 5 schematically illustrates an architecture of an RPU cell which can be implemented in the RPU array of FIG. 4, according to an exemplary embodiment of the disclosure.

FIG. 5 schematically illustrates an architecture of an RPU cell 500 which can be implemented in the RPU array of FIG. 4, according to an exemplary embodiment of the disclosure. The RPU cell 500 comprises a plurality of weight update and read circuit blocks 500A, 500B, 500C and 500D which have shared access to a single weight storage capacitor 560 through a transmission gate 570 to perform weight read and update operations in parallel using the single weight storage capacitor 560. Each weight update and read circuit block 500A, 500B, 500C, and 500D comprises a NAND gate 510, an inverter 520, a first current source 530, a second current source 540, and a read transistor 550. In some embodiments, as shown in FIG. 5, the first current source 530 can be implemented using a PMOS transistor and the second current source 540 can be implemented using an NMOS transistor. The first and second current sources 530 and 540 are serially connected between a positive power supply node VDD and a negative power supply node VSS (e.g., ground). The weight storage capacitor 560 is connected between a node N1 and the negative power supply node VSS. The transmission gate device 570 is connected between the first node N1 and a second node N2. The read transistors 550 have gate terminals that are commonly connected to the second node.

As shown in FIG. 5, each weight update and read circuit block 500A, 500B, 500C, and 500D is connected to a pair of row control lines and a pair of column control lines. In particular, in the weight update and read circuit block 500A, the read transistor 550 comprises source/drain terminals that are connected to read row (Read_XA) and read column (Read_YA) control lines, and the NAND gate 510 has inputs connected to update row (Update_XA) and update column (Update_YA) control lines. In the weight update and read circuit block 500B, the read transistor 550 comprises source/drain terminals that are connected to read row (Read_XB) and read column (Read_YB) control lines, and the NAND gate 510 has inputs connected to update row (Update_XB) and update column (Update_YB) control lines. In the weight update and read circuit block 500C, the read transistor 550 comprises source/drain terminals that are connected to read row (Read_XC) and read column (Read_YC) control lines, and the NAND gate 510 has inputs connected to update row (Update_XC) and update column (Update_YC) control lines. In the weight update and read circuit block 500D, the read transistor 550 comprises source/drain terminals that are connected to read row (Read_XD) and read column (Read_YD) control lines, and the NAND gate 510 has inputs connected to update row (Update_XD) and update column (Update_YD) control lines.

The NAND gate 510, the inverter 520, and the first and second current sources 530 and 540 comprise weight update circuitry in the circuit blocks 500A, 500B, 500C, and 500D, wherein the weight update circuitry is configured to update a weight value of the RPU cell 500 that is stored in the form of a weight voltage $V_W$ in the weight storage capacitor 560. The read transistors 550 comprise weight read circuitry in the circuit blocks 500A, 500B, 500C, and 500D, wherein the weight read circuitry is configured to read the weight value of the RPU cell 500 that is stored in the form of the weight voltage $V_W$ in the weight storage capacitor 560.

In the RPU cell 500, the weight storage capacitor 560 serves as a memory element which stores a weight value of the RPU cell 500 in the form of a capacitor voltage, or weight voltage $V_W$. To perform a weight read operation, the transmission gate 570 is enabled by an external "Enable" control signal that is applied to the passage 570 of the RPU cells to connect the nodes N1 and N2, and thereby apply the capacitor voltage, or weight voltage $V_W$, to the gate terminals of the read transistors 550 to modulate the channel resistance of the read transistors 550. The charge state stored in the weight storage capacitor 560 is read by applying small bias across the source/drain terminals of a given read transistors 550 and measuring the current, $I_{READ}$. As noted above, for forward and backward (read) operation operations, voltage pulses with predefined amplitude, e.g. VDD and VDD—0.1, are applied to the read transistors 550 from the read row and read column control lines (Read_XA/Read_YA), (Read_XB/Read_YB), (Read_XC/Read_YC), and (Read_XD/Read_YD) connected to the respective circuit blocks 500A, 500B, 500C, and 500D of the RPU cell 500. The small source-drain voltage that is generated in the read transistors 550 causes the read transistors 550 to operate in a triode region in which the on-resistance depends on the weight voltage $V_W$, which voltage is applied to the gate terminal of the read transistor 550.

Each block 500A, 500B, 500C, and 500D of the RPU cell 500 implements a weight update process using a stochastic computing scheme where a local multiplication operation is performed in each block 500A-500D using a coincidence detection method via the NAND gates 510. With the NAND gate 510 and inverter logics coupled to the respective update row (e.g., Update_Xi) and update column (Update_Yj) control lines, a given one of the circuit blocks 500A-500D can update the stored weight in the RPU cell 500 when two stochastic pulses from update lines (row and column) connected to the given circuit block are coinciding. For example, in the circuit block 500A, when both Update_XA and Update_YA signals are logic "1" for a update operation, the output of the NAND gate 510 will be logic "0" and the output of the inverter 520 will be logic "1". Then, depending on which current source 530 or 540 is in operation, the circuit block 500A will either charge or discharge the weight storage capacitor 560.

For example, when the current source 530 is in an operational state and the current source 540 is deactivated (e.g., gate terminal of current source 540 is shorted to VSS), a logic "0" pulse output from the NAND gate 510 will temporarily turn on the current source 530 to provide charging current to the node N2 which, in turn, charges the weight storage capacitor 560 (e.g., increase the weight voltage $V_W$ of the capacitor 560 by a minimum unit voltage change $+\Delta V$). On the other hand, when the current source 540 is in an operational state and the current source 530 is deactivated (e.g., gate terminal of current source 530 is shorted to VDD), a logic "0" pulse output from the NAND gate 510 will generate a logic "1" pulse at the output of the inverter 520. The logic "1" pulse at the output of the inverter 520 will temporarily turn on the current source 540 to pull current from the node N2 which, in turn, discharges the weight storage capacitor 560 (e.g., decrease the weight voltage $V_W$ of the capacitor 560 by a minimum unit voltage change $-\Delta V$).

Again, as noted above, the RPU cell 500 comprises additional circuitry (not shown) which, in response to control signals from the peripheral circuitry, is configured selectively connect (i.e., short) the gate terminals of the current sources 530 and 540 to VDD and VSS, respectively, in each of the circuit blocks 500A-500D, depending on whether the given circuit block is to update the weight by increasing or decreasing the weight voltage $V_W$. Various types of control circuit configurations can be implemented to selectively control the current sources 530 and 540 or otherwise control the direction (weight increase or decrease) of the weight update operations of each of the given circuit blocks 500A, 500B, 500C, and 500D, the details of which are not necessary for understanding the exemplary embodiments discussed herein.

In an exemplary embodiment where the RPU cell 500 is utilized to perform forward, backward and update cycles of backpropagation process for training a neural network using a SGD process, the RPU cell 500 operates as follows. For a forward cycle, the current sources 530 and 540 are turned off to disable the weight update circuitry in each of the circuit blocks 500A-500D. The RPU cell 500 comprises additional circuitry (not shown) which, in response to control signals from the peripheral circuitry, is configured connect the gate terminals of the current sources 530 and 540 to VDD and VSS, respectively, thereby causing the current sources 530 and 540 to be deactivated and remain deactivated independent of the input to the NAND gates 510. These control signals are applied outside the update cycle so that no unintentional weight updates occur. Moreover, for the forward cycle, the transmission gate 570 of the RPU cell 500 is enabled by asserting the "Enable" control signal to connect the weight storage capacitor 560 to the node N2. In this state, the weight voltage $V_W$ is applied to the gate terminals of each of the read transistors 550 in the circuit blocks 500A-500D, data (e.g., read pulses) are applied to the read row control lines, Read_Xi (i=A, B, C, D), and the read currents from the circuit blocks 500A, 500B, 500C and 500D of the RPU cell 500 are collected through the respective read column control lines, Read_Yj (j=A, B, C, D) and integrated in the peripheral circuits to generate digital values that are used to accomplish vector-matrix multiplication for the forward operation.

For a backward cycle, the current sources 530 and 540 are turned off to disable the weight update circuitry in each of the circuit blocks 500A-500D, and the transmission gate 570 of the RPU cell 500 is enabled by asserting the "Enable" control signal to connect the weight storage capacitor 560 to the node N2. In this state, the weight voltage $V_W$ is applied to the gate terminals of each of the read transistors 550 in the circuit blocks 500A-500D, the data are applied to the read column control lines, Read_Yj (j=A, B, C, D), and the read currents from circuit blocks 500A, 500B, 500C and 500D of the RPU cell 500 are collected through the respective read row control lines, Read_Xj (i=A, B, C, D) and integrated in the peripheral circuits to generate digital values that are used to accomplish vector-matrix multiplication for the backward operation.

As noted above, the different circuit blocks 500A, 500B, 500C, and 500D of the RPU cell 500 allow multiple (e.g., 4) input volumes (e.g., patches, error matrix) to be processed in parallel using the same kernel matrix in the forward and backward operations. For a weight update cycle, the transmission gate 570 of the RPU cell 500 is enabled by asserting the "Enable" control signal to connect the weight storage capacitor 560 to the node N2. In this state, weight update signals are sent to the update control lines Update_Xi (I=A, B, C, D) and Update_Yj (j=A, B, C, D) of the circuit blocks 500A-500D, wherein the weight update circuitry in each circuit block 500A, 500B, 500C, and 500D updates the stored weight value in the storage capacitor 560 in an "additive" manner by increasing or decreasing the weight voltage $V_W$ according to the respective weight update signals applied to the circuit blocks 500A-500D. In this embodiment, since the weight update signals received by each of the circuit blocks 500A-500D are all based on processing results of the operations performed using the same kernel matrix on 4 different input volumes, the resulting updated weight value that is obtained through the parallel processing of 4 different input volumes at the same time using the same kernel is the same or similar to an updated weight value that would have been generated by performing a sequence of 4 separate backpropagation cycles one each of the 4 different input volumes (e.g., patches) using the same kernel.

While FIGS. 4 and 5 illustrate an exemplary embodiment where each RPU cell comprise four circuit blocks A, B, C and D, it is to be understood that each RPU cell can be designed with any number of circuit blocks, depending on the configuration, and the given technology. For example, while designing RPU cells with 8 or 16 separate blocks that share a single weight storage capacitor can be readily envisioned, the large number of row and column control lines needed for such implementation can be prohibitive, depending on the technologies used and the associated integration densities that can be achieved Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A device, comprising:
a resistive processing unit cell, wherein the resistive processing unit cell comprises:
a plurality of circuit blocks, wherein each circuit block comprises a weight update circuit coupled to dedicated update control lines, and a weight read circuit coupled to dedicated read control lines; and
a weight storage device configured to store a weight voltage which represents a weight value of the resistive processing unit cell;
wherein the resistive processing unit cell is configured to enable shared access to the weight storage device by the plurality of circuit blocks;
wherein the plurality of circuit blocks are configured to operate in parallel to perform separate weight read operations in which each read circuit is configured to generate a read current based on the stored weight voltage of the resistive processing unit cell, and output the read current on the dedicated read control lines of the read circuit;
wherein the plurality of circuit blocks are configured to operate in parallel to perform separate weight update operations in which each weight update circuit is configured to receive respective update control signals on the dedicated update control lines, generate an update current based on the respective update control signals, and apply the update current to the weight storage device to adjust the stored weight voltage based on the update current; and wherein at least two of the plurality of circuit blocks of the resistive processing unit cell are configured to concurrently operate on a different data set using the same weight value of the resistive processing unit cell.

2. The device of claim 1, wherein the resistive processing unit cell further comprises:

a transmission gate coupled to the weight storage device and to each of the circuit blocks;

wherein the transmission gate selectively connects the weight storage device to each of the circuit blocks of the resistive processing unit cell in response to an assertion of a transmission gate enable signal.

3. The device of claim 1, wherein the weight storage device comprises a capacitor.

4. The device of claim 1, wherein the weight value of the resistive processing unit cell represents a value of a kernel matrix of a convolution layer of a neural network.

5. The device of claim 1, wherein each of the plurality of circuit blocks of the resistive processing unit cell is configured to concurrently operate on a different data set using the same weight value of the resistive processing unit cell.

6. The device of claim 1, where the weight read circuit of each circuit block of the resistive processing unit cell comprises a read transistor comprising a gate terminal, a first source/drain terminal, and a second source/drain terminal, wherein the gate terminal is connected to the weight storage device, wherein the first source/drain terminal is connected to a row read control line, and wherein the second source/drain terminal is connected to a column read control line, wherein the read transistor is configured to generate a weight current in response to the weight voltage applied to the gate terminal of the read transistor.

7. The device of claim 1, where the weight update circuit of each circuit block of the resistive processing unit cell comprises:

a coincidence detector having a first input connected to an update row control line and a second input connected to an update column control line;

a first current source; and a second current source;

wherein the coincidence detector is configured to output a detection signal in response to each detected coincidence of stochastic bits streams of input vectors applied on the update row and update column control lines; and wherein the first and second current sources are configured responsive to the detection signal to generate one of a charging current and a discharging current to the weight storage device to update the storage weight voltage.

8. The device of claim 1, wherein the device comprises a resistive processing unit crossbar array system comprising an array of resistive processing unit cells.

9. A device comprising:

an array of resistive processing unit cells;

a plurality of weight update control lines coupled to each resistive processing unit cell in the array;

a plurality of weight read control lines coupled to each resistive processing unit cell in the array; and control circuitry configured to control the array of resistive processing unit cells, wherein the control circuitry is configured to (i) generate read control signals that are applied to the weight read control lines to read weights of the resistive processing unit cells, and (ii) generate weight update control signals that are applied to the weight update control lines to update weights of the resistive processing unit cells;

wherein each resistive processing unit cell in the array of resistive processing unit cells comprises:

a plurality of circuit blocks, wherein each circuit block comprises a weight update circuit coupled to dedicated update control lines, and a weight read circuit coupled to dedicated read control lines; and a weight storage device configured to store a weight voltage which represents a weight value of the resistive processing unit cell;

wherein the resistive processing unit cell is configured to enable shared access to the weight storage device by the plurality of circuit blocks of the resistive processing unit cell;

wherein the plurality of circuit blocks are configured to operate in parallel to perform separate weight read operations in which each read circuit of the resistive processing unit cell is configured to generate a read current based on the stored weight voltage of the resistive processing unit cell, and output the read current on the dedicated read control lines of the read circuit;

wherein the plurality of circuit blocks are configured to operate in parallel to perform separate weight update operations in which each weight update circuit of the resistive processing unit cell is configured to receive respective update control signals on the dedicated update control lines, generate an update current based on the respective update control signals, and apply the update current to the weight storage device to adjust the stored weight voltage based on the update current; and wherein at least two of the plurality of circuit blocks of the resistive processing unit cell are configured to concurrently operate on a different data set using the same weight value of the resistive processing unit cell.

10. The device of claim 9, wherein each resistive processing unit cell further comprises:

a transmission gate coupled to the weight storage device and to each of the circuit blocks;

wherein the transmission gate selectively connects the weight storage device to each of the circuit blocks of the resistive processing unit cell in response to an assertion of a transmission gate enable signal.

11. The device of claim 9, wherein the weight storage device of each resistive processing unit cell in the array comprises a capacitor.

12. The device of claim 9, wherein the weight value of each resistive processing unit cell represents a value of a kernel matrix of a convolution layer of a neural network.

13. The device of claim 9, wherein each of the plurality of circuit blocks of each of the resistive processing unit cells is configured to concurrently operate on different data sets using the same weight values of the resistive processing unit cells.

14. The device of claim 9, wherein the weight read circuit of each circuit block of each resistive processing unit cell comprises a read transistor comprising a gate terminal, a first source/drain terminal, and a second source/drain terminal, wherein the gate terminal is connected to the weight storage device, wherein the first source/drain terminal is connected to a row read control line, and wherein the second source/drain terminal is connected to a column read control line, wherein the read transistor is configured to generate a weight current in response to the weight voltage applied to the gate terminal of the read transistor.

15. The device of claim 9, where the weight update circuit of each circuit block of each resistive processing unit cell comprises:
   a coincidence detector having a first input connected to an update row control line and a second input connected to an update column control line;
   a first current source; and
   a second current source;
   wherein the coincidence detector is configured to output a detection signal in response to each detected coincidence of the stochastic bits streams of the input vectors applied on the update row and update column control lines; and
   wherein first and second current sources are responsive to the detection signal to generate one of a charging current and a discharging current to the weight storage device to update the storage weight voltage.

16. The device of claim 9, wherein the device comprises a resistive processing unit crossbar array system comprising the array of resistive processing unit cells.

17. A method comprising:
   mapping kernel values of a convolutional kernel to an array of resistive processing unit cells which represents a convolutional layer of a neural network, wherein each resistive processing unit cell comprises (i) a weight storage device configured to store a weight voltage which represents a kernel value of the convolutional kernel, and (ii) a plurality of circuit blocks, wherein each circuit block comprises a weight update circuit coupled to dedicated update control lines, and a weight read circuit coupled to dedicated read control lines;
   inputting a plurality of different input volumes to the array of resistive processing unit cells to perform a training process, wherein a number of the different input volumes equals a number of the circuit blocks of each resistive processing unit cell; and
   performing a training process to train the kernel values of the convolutional kernel, wherein the training process comprises concurrently applying the convolutional kernel to each of the different input volumes in parallel by (i) performing separate weight read operations in parallel in each resistive processing unit cell wherein each read circuit is configured to generate a read current based on the stored weight voltage of the resistive processing unit cell, and output the read current on the dedicated read control lines of the read circuit, and (ii) performing separate weight update operations in parallel in each resistive processing unit cell wherein each weight update circuit is configured to receive respective update control signals on the dedicated update control lines, generate an update current based on the respective update control signals, and apply the update current to the weight storage device to adjust the stored weight voltage based on the update current;
   wherein each corresponding circuit block in the resistive processing unit cells processes a corresponding one of the input volumes; and
   wherein at least two of the plurality of circuit blocks of at least a given one of the resistive processing unit cells are configured to concurrently operate on a different one of the input volumes set using the same weight value of the given resistive processing unit cell.

18. The method of claim 17, wherein the input volumes comprise patches of an image volume.

19. The method of claim 17, wherein the input volumes comprise output volumes of a previous convolutional layer.

20. The method of claim 17, wherein each resistive processing unit cell comprises at least a first and second circuit block, wherein the input volumes comprise at least a first and second input volume, and wherein the first and second circuit blocks of each resistive processing unit cell processes the first and second input volume, respectively, of the input volumes.

\* \* \* \* \*